(12) United States Patent
Huang et al.

(10) Patent No.: US 7,010,712 B1
(45) Date of Patent: Mar. 7, 2006

(54) METHOD AND SYSTEM FOR SYNCHRONIZING SERIAL DATA STREAMS IN MULTIPLE-PORT DESIGN

(75) Inventors: Shih-Hsing Huang, San Jose, CA (US); Narayanan Raman, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 533 days.

(21) Appl. No.: 10/282,379

(22) Filed: Oct. 28, 2002

(51) Int. Cl.
*G06F 1/12* (2006.01)
*H04L 7/00* (2006.01)

(52) U.S. Cl. .................. 713/400; 713/500; 713/502

(58) Field of Classification Search ............... 713/375, 713/400, 500, 502, 600
See application file for complete search history.

(56) References Cited

U.S. PATENT DOCUMENTS 5,006,979 A * 4/1991 Yoshie et al. ............... 713/375
6,188,286 B1 * 2/2001 Hogl et al. ..................... 331/2

OTHER PUBLICATIONS

"Etherent PHY-110 Core", DB08-000181-00 Mar. 2002, pp. 1-17.

* cited by examiner

*Primary Examiner*—Thuan Du
(74) *Attorney, Agent, or Firm*—Thelen Reid & Priest, LLP

(57) ABSTRACT

A method synchronizes serial data stream output from a multiple-port system. The multiple-port system includes a plurality of port devices. The method includes (a) timing a serial data stream at each port device, the serial data stream including a series of data frames, (b) generating a framing signal at each port device, the framing signal indicating a boundary of the data frame in the serial data stream, (c) supplying the framing signal to a next port device, and (d) synchronizing, at each next port, the timing of the serial data stream in response to the supplied framing signal.

29 Claims, 3 Drawing Sheets

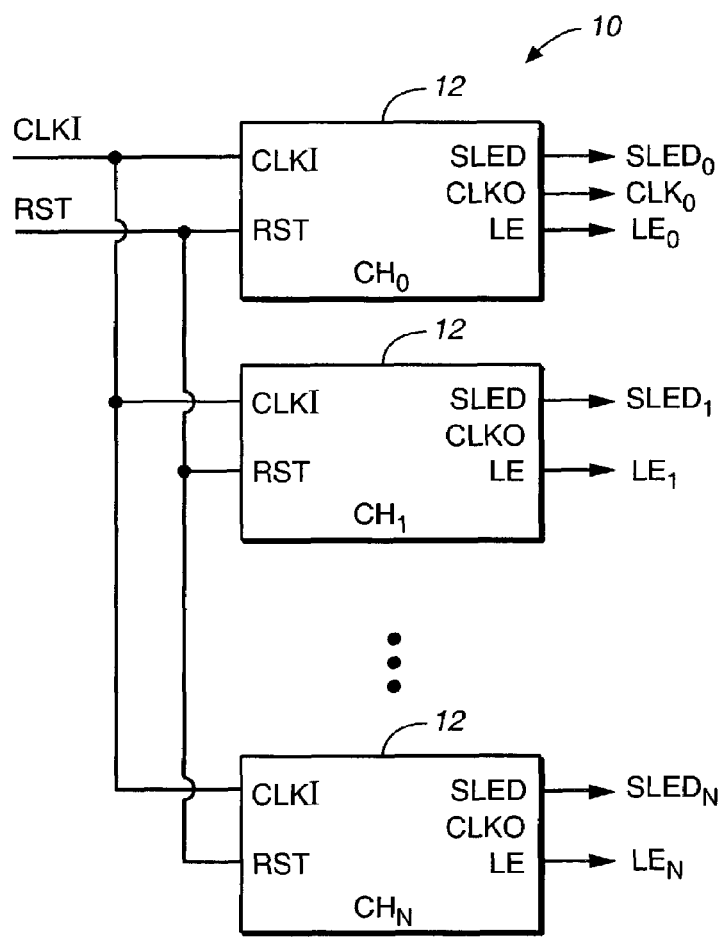
FIG._1
*(PRIOR ART)*
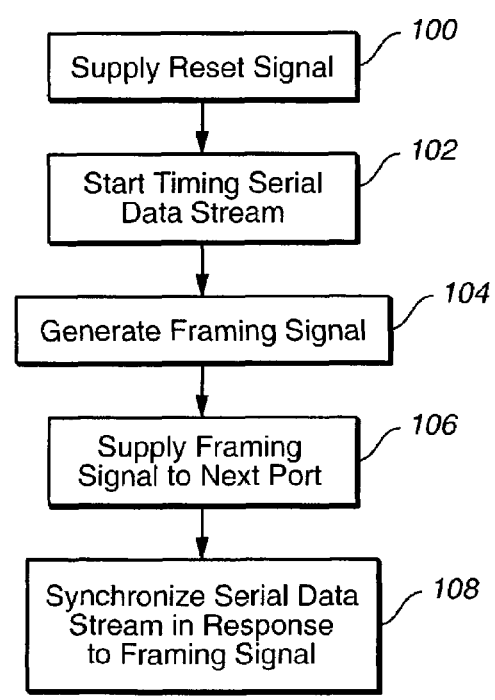
FIG._4

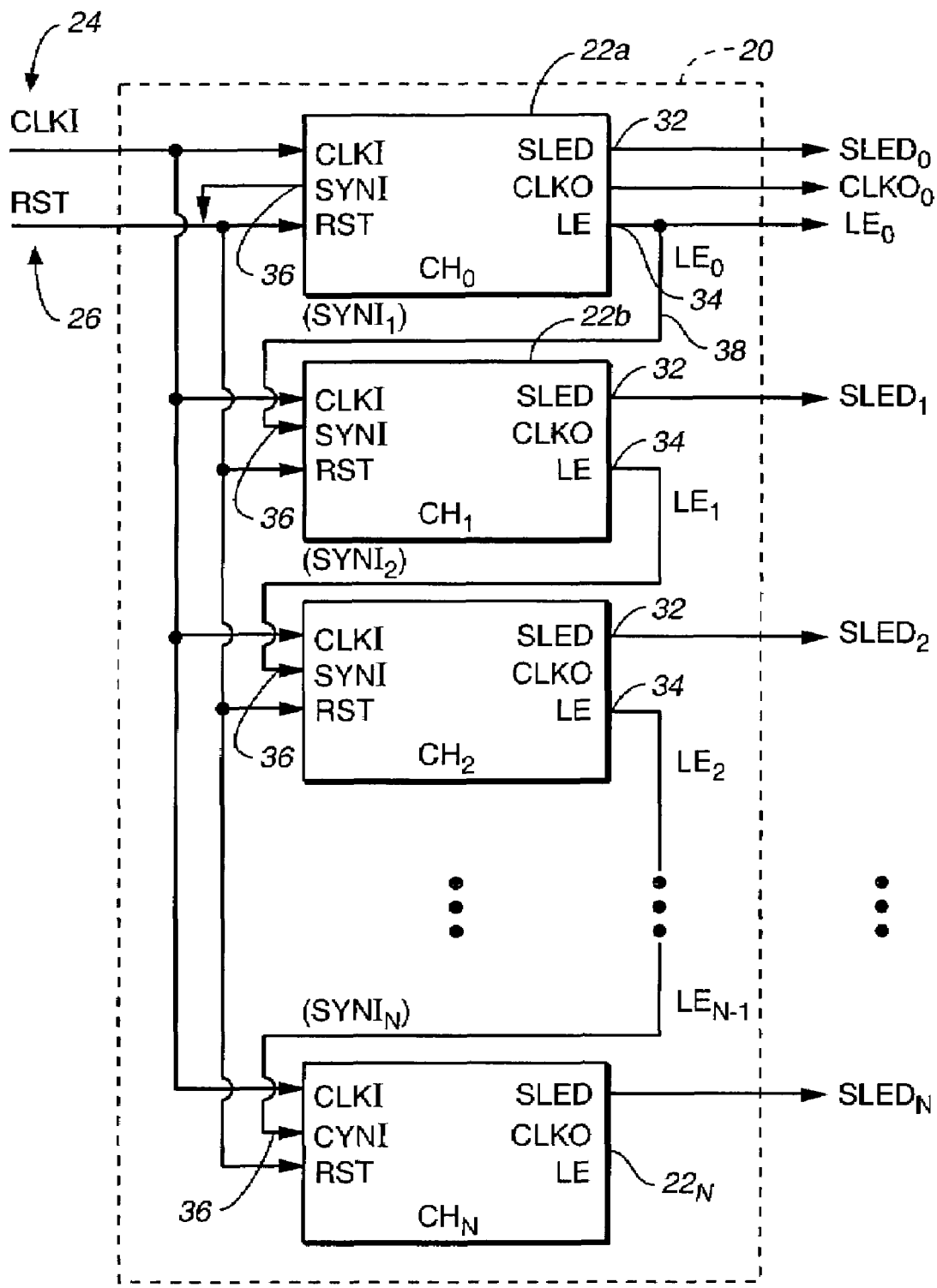
FIG._2

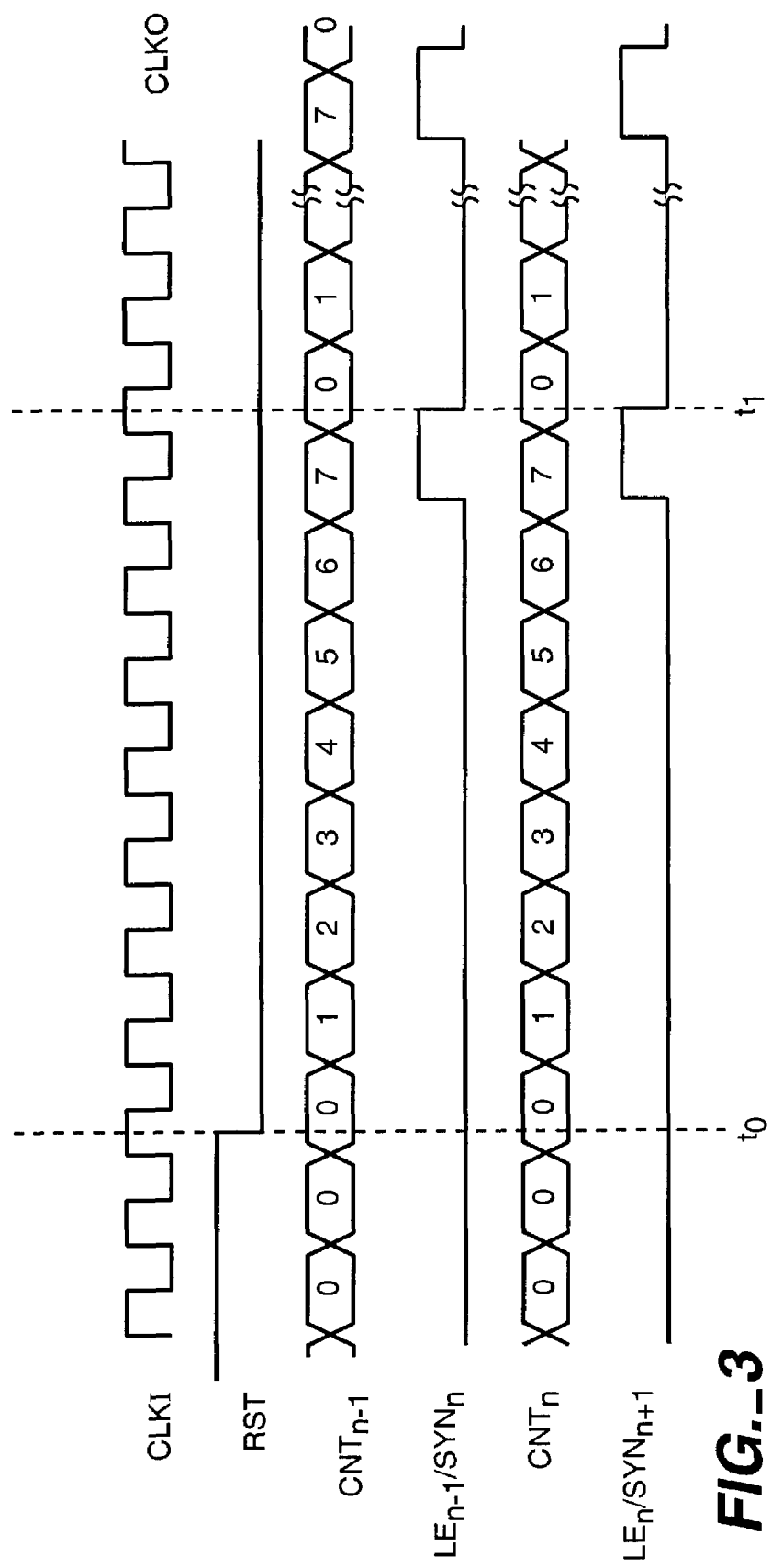
FIG._3

METHOD AND SYSTEM FOR SYNCHRONIZING SERIAL DATA STREAMS IN MULTIPLE-PORT DESIGN

FIELD OF THE INVENTION

The present invention relates to a multiple-port system in an integrated circuit design. More particularly, the present invention relates to a multiple-port system and a method for synchronizing serial data streams output from multiple ports.

BACKGROUND OF THE INVENTION

Physical layer devices, such as PHY-110 core, available from LSI Logic Corporation of Milpitas, Calif., output signals indicating the speed of operation, status of the link, activity, and the like. A system designer can use these signals to drive a display device such as light emitting diodes (LEDs) to monitor the device operation. In the case of a single port device, or a single-channel application, several (for example, four) signals are monitored and the corresponding number of output pins are assigned.

However, in a multiple-port device or a multiple-channel application, the number of the signal output pins is dramatically increased. For example, in a 12-port design the chip will need 48 signal pins (four pins per port) for just driving the LEDs. Since the chip must provide other pins for various interfaces (media interface, controller interface, management interface, scan interface, and the like), such a large number of monitoring pins is not desirable.

One conventional solution for the problem is to serialize the monitoring signals so as to reduce the pin number required for this function. That is, the information that was provided previously on separate pins is all sent serially as a stream to a single pin. Such a serial data stream is typically provided with a clock signal for timing and a latch enable signal for framing. Such signal serialization may be straightforward for a multiple port application where individual ports are not based on a single instance of the identical channel core.

However, in a multiple-port application where each port (or channel core) is a single instance of the identical port device (or channel core), serialization of the output signals is not so straightforward. Since each port may also be required to support a single-port application, the port level output signal is also serialized. Thus, in such a multiple-port design, each output signal from an individual port is already a serial data stream, which is timed by a clock signal and framed by its own latch enable signal.

FIG. 1 schematically illustrates a conventional multiple-port system 10 including a plurality of port devices 12. Each port device 12 is considered as a single instance of the identical port. Such a multiple-port system 10 may be implemented as an application specific integrate circuit (ASIC) or Application Specific Standard Product (ASSP), and typically used in a network interface chip or network interface card. Each port device 12 may be an individual channel core provided in a multiple-channel application of a system-on-chip design. Each port device 12 is supplied with a common clock signal (CLKI) and a common reset signal (RST). Other control signals, data signals, and the like (not shown) may also be supplied to each port device 12. Each port device 12 outputs a serial data stream (SLEDn), a clock signal (CLKOn), and a latch enable signal (LEn), where n=0, 1, . . . , N. Since the clock signal is common to all port devices, the output clock signals (CLKO) may be omitted from port devices except one.

Since each serial data stream is individually framed in a port device by a respective latch enable signal LE, although all of the port devices 12 simultaneously start timing the serial data streams (initiated by the reset signal), it is not guaranteed that these serial data streams remain synchronized in the course of operation. Once framing of the serial data stream is out of timing at one or more of the port devices due to noise, delay, and the like, there is no measure to recover synchronization. However, the synchronization across the data streams is required since an external device using this information expects all the serial data streams output from the multiple-pert system 10 to be synchronized. Therefore, it would be desirable to provide a scheme ensuring the synchronization across the serial data stream.

BRIEF DESCRIPTION OF THE INVENTION

A method synchronizes serial data stream output from a multiple-port system. The multiple-port system includes a plurality of port devices. The method includes (a) timing a serial data stream at each port device, the serial data stream including a series of data frames, (b) generating a framing signal at each port device, the framing signal indicating a boundary of the data frame in the serial data stream, (c) supplying the framing signal to a next port device, and (d) synchronizing, at each next port, the timing of the serial data stream in response to the supplied framing signal.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is a block diagram schematically illustrating a conventional multiple-port system including a plurality of port devices.

FIG. 2 is a block diagram schematically illustrating a multiple-port system for synchronizing serial data streams output from multiple ports, in accordance with one embodiment of the present invention.

FIG. 3 is a timing diagram schematically illustrating waveforms of the signals in the port devices in accordance with one embodiment of the present invention.

FIG. 4 is a process flow diagram schematically illustrating a method for synchronizing serial data streams output from a multiple-port system, in accordance with one embodiment of the present invention.

DETAILED DESCRIPTION

Embodiments of the present invention are described herein in the context of a system and method for synchronizing serial data streams in a multiple port design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 2 schematically illustrates a multiple-port system 20 for synchronizing serial data streams output from multiple ports, in accordance with one embodiment of the present invention. The multiple-port system 20 includes a plurality of port devices 22 (22a, 22b, ... 22$_N$). The multiple-port system 20 may be implemented as an ASIC or ASSP and used in a network interface chip, network interface card, and the like. Each of the port devices 22 is identical, and may be an individual channel core in a multiple-channel application of such a network device. For example, the port devices 22 may be physical layer devices or transceivers, such as PHY-110 core, available from LSI Logic Corporation of Milpitas, Calif.

As shown in FIG. 2, each port device 22 receives a common clock signal (CLKI) 24 and a reset signal (RST) 26. Each port device 22 generates a serial data stream (SLED) and outputs the serial data stream from a data output 32. The serial data stream includes a series of data frames. Typically, each data frame includes a predetermined number of data units or bits. For example, each data frame has information of a status of the port device 22 at a specific time, and each data unit (bit) in a frame may correspond to a specific event of the port device. Each port device 22 also generates a framing signal (LE) and outputs the framing signal from an output 34. The framing signal indicates a boundary of the data frame in the serial data stream. Each port device 22 includes a timing device (not shown) for timing the serial data stream in accordance with the clock signal CLKI. For example, the timing device may include a counter counting the bits (or data unit) of the serial data stream.

Each port device 22 also receives a synchronization signal (SYNI) at a synchronization input 36. In response to the synchronization signal, the timing device refreshes its counting the data units of the serial data stream. As shown in FIG. 2, the multiple-port device 20 further includes a synchronization signal line 38 which couples the framing signal output 34 of a port device to the synchronization signal input 36 of a next port device. Thus, the framing signal (LE$_{n-1}$) of a (n−1)-th port device 22 is supplied to the n-th port device 22 as the synchronization signal (SYN$_n$), where the multiple-port system 20 includes (N+1) port devices 22, and n=1, 2, ... N.

FIG. 3 schematically illustrates the waveforms of the signals in the port devices 22. As described above, the port device 22 receives the reset signal (RST) 26, which triggers the timing device to start timing the serial data stream. For example, the timing device starts counting the data unit of the serial data stream. Signals CNT$_{n-1}$ and CNT$_n$ depict respective counts of the timing devices of the (n−1)-th and n-th port devices 22. Since the reset signal (RST) is common to all of the port devices 22, the counting is initiated at the same time (t$_0$) in each port device 22. In this example, each frame includes 8 data units (8 bits). At the end of a frame, i.e., upon or after counting each eighth bit, the framing signal (LE$_{n-1}$) is generated as a single pulse, which signifies the boundary of the frame. Alternatively, the framing signal pulse may be generated at the beginning of a frame. The framing signal LE is also referred to as a latch enable signal since it restart/reset the counting operation of the timing device. It should be noted that each frame may include any predetermined number of bits (or data units) in accordance with a specific application.

As shown in FIG. 2, the framing signal LE of a port device is coupled to the next port device as the synchronization signal SYN. At the next port device the synchronization signal SYN$_n$ operates as a local reset signal which triggers the timing device to restart counting from the first bit of the frame. In other words, when the port device 22 sees the synchronization signal pulse (at time t$_1$ in FIG. 2, for example), the timing device start over from the first bit of the frame regardless of the current number of bit count. Thus, even if a misalignment occurs in the frame-counting at a certain port device 22 for some reason, such a misalignment is corrected by the framing signal (LE$_{n-1}$) of the adjacent port device 22 within a frame. This ensures synchronization of the serial data streams output from the individual port devices 22.

As shown in FIG. 2, the synchronization signal input of the first port device 22a may be grounded, and the N-th (or last) port device 22$_N$ does not outputs the framing signal (LE). The input clock signal CLKI may be output from one of the plurality of port device 22 (typically the first port device 22a) as an output clock signal CLKO of the multiple-port system 20. Similarly, since all of the framing signals LE are also synchronized, as shown in FIG. 3, only one of the framing signals LE (typically, that output from the first port device 22a) is output from the multiple-port system 20. Thus, in accordance with one embodiment of the present invention, the multiple-port system 20 outputs the synchronized serial data streams (SLED$_0$–SLED$_N$), the output clock signal (KLCO), and one framing signal (LE$_0$) through corresponding nodes. Other than the first port device 22a, only one node per port is required to output the serial data.

FIG. 4 schematically illustrates a method for synchronizing serial data streams output from a multiple-port system, in accordance with one embodiment of the present invention. The multiple-port system includes a plurality of port devices, and may be a multiple-port system 20 described above. A serial data stream includes a series of data frames, and timing of the serial data stream is provided at each port device. If each data frame includes a predetermined number of data units (or bits), the serial data stream may be timed by counting the data units (bits).

At the beginning of operation, a reset signal is typically supplied to each port device (100), and timing the serial data stream (counting frame bits) is started in response to the reset signal at each port device (102). A framing signal is generated at each port device (104). The framing signal indicates a boundary of the data frame in the serial data stream. For example, the framing signal is a latch enable signal indicating the end of a frame. When each frame includes a predetermined number of data units (or bits), the boundary of the frames may be obtained by counting the data units (bits) in accordance with a clock signal. The framing signal is supplied to a next port device (106), and the timing of the serial data stream (counting frame bit) is synchronized at each port device in response to the supplied framing signal (108). That is, at each port device, the timing of the serial data stream is aligned in response to the received framing signal. For example, the framing signal includes pulses, and each pulse corresponds to the end of a data frame. At the next port device, counting of the data frame is restarted in response to the pulse of the received framing signal. Since the serial data stream of each port device is synchronized by the framing signal of the adjacent port device, all of the serial data streams are also synchronized.

As described above, the serial data streams that are output from individual channels or port devices are synchronized. The present invention is applicable to any number of ports and also supports any size of the data frame. The framing signal (or latch enable signal) marks the frame boundary of the serial data stream. The framing signal of a first port device is tied to the following port device as the synchronization signal. Thus, the port devices are "chained" by the framing/synchronization signal each other. The synchronization signal input of the first port in the chain is tied to the Ground. The logic circuit that implements the serial data stream uses the framing signal supplied from an adjacent port device to align its frame timing of the serial data stream. This scheme ensures that the serial data streams of all the ports are synchronized to the same frame signal.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for synchronizing serial data stream output from a multiple-port system, the multiple-port system including a plurality of port devices, said method comprising:
   timing a serial data stream at each port device, the serial data stream including a series of data frames, said timing including counting a number of data units in each data frame;
   generating a framing signal at each port device, the framing signal indicating a boundary of the data frame in the serial data stream;
   supplying the framing signal to a next port device;
   synchronizing, at each next port, a data frame timing of the serial data stream by restarting said counting the data units in each data frame in response to the supplied framing signal; and
   outputting the synchronized serial data stream from each port device.

2. A method in accordance with claim 1, further comprising:
   supplying a reset signal to each port device; and
   starting said timing in response to the reset signal at each port device.

3. A method in accordance with claim 1 wherein the framing signal is a latch enable signal indicating the end of a frame.

4. A method in accordance with claim 1 wherein each data frame including information of a status of the port device at specific time.

5. A method in accordance with claim 1 wherein each frame including a predetermined number of data units.

6. A method in accordance with claim 1 wherein the data unit is a bit.

7. A method in accordance with claim 1 wherein the framing signal includes pulses, each pulse corresponding to the end of a data frame.

8. A method in accordance with claim 7 wherein said synchronizing includes:
   restarting said counting in response to the pulse of the framing signal.

9. A multiple-port system for synchronizing serial data stream output from multiple ports, said system comprising:
   a plurality of port devices, each port device including
      a data output for outputting a serial data stream, the serial data stream including a series of data frames,
      a timing device for timing the serial data stream by counting a number of data units in each data frame,
      a framing signal output for outputting a framing signal, the framing signal indicating a boundary of the data frame in the serial data stream,
      a synchronization signal input for receiving a synchronization signal, said timing device synchronizing a data frame timing of the serial data stream by restarting counting the data units in each data frame in the serial data steam in response to the synchronization signal; and
   a synchronization signal line coupling said framing signal output of a port device to said synchronization signal input of a next port device.

10. A system in accordance with claim 9 wherein each of said port devices further includes:
   a reset signal input for receiving a reset signal, said timing device starting timing in response to the reset signal.

11. A system in accordance with claim 10 wherein each of said port devices further includes:
   a clock signal input for receiving a clock signal.

12. A system in accordance with claim 11 wherein a first port device of said plurality of port devices further includes:
   a clock signal output for outputting the clock signal.

13. A system in accordance with claim 12 wherein the synchronization signal input of the first port device is grounded.

14. A system in accordance with claim 12, further comprising:
   a clock signal output node for outputting the clock signal from the first port device;
   a framing signal output node for outputting the framing signal from the first port device; and
   a serial data output node provided for each port device, for outputting the serial data stream from the corresponding port device.

15. A system in accordance with claim 9 wherein the framing signal is a latch enable signal indicating the end of a frame.

16. A system in accordance with claim 9 wherein each data frame including information of a status of the port device at specific time.

17. A system in accordance with claim 9 wherein each frame including a predetermined number of data units.

18. A system in accordance with claim 17 wherein said timing device includes:
   a counter for counting the number of data units in each data frame.

19. A system in accordance with claim 18 wherein the data unit is a bit.

20. A system in accordance with claim 18 wherein the framing signal includes pulses, each pulse corresponding to the end of a data frame.

21. A system in accordance with claim 20 wherein said timing device restarts timing the serial data stream in response to the pulse of the framing signal.

22. An apparatus for synchronizing serial data stream output from a multiple-port system, the multiple-port system including a plurality of port devices, said apparatus comprising:

means for timing a serial data stream at each port device, the serial data stream including a series of data frames, said means for timing including means for counting a number of data units in each data frame;

means for generating a framing signal at each port device, the framing signal indicating a boundary of the data frame in the serial data stream;

means for supplying the framing signal to a next port device;

means for synchronizing, at each next port, a data frame timing of the serial data stream by restarting said means for counting the number of data units in each data frame in response to the supplied framing signal; and means for outputting the synchronized serial data stream from each port device.

23. An apparatus in accordance with claim 22, further comprising:

means for supplying a reset signal to each port device; and means for starting said means for timing in response to the reset signal at each port device.

24. An apparatus in accordance with claim 22 wherein the framing signal is a latch enable signal indicating the end of a frame.

25. An apparatus in accordance with claim 22 wherein each data frame including information of a status of the port device at specific time.

26. An apparatus in accordance with claim 22 wherein each frame including a predetermined number of data units.

27. An apparatus in accordance with claim 22 wherein the data unit is a bit.

28. An apparatus in accordance with claim 22 wherein the framing signal includes pulses, each pulse corresponding to the end of a data frame.

29. An apparatus in accordance with claim 28 wherein said means for synchronizing includes:

means for restarting said counting in response to the pulse of the framing signal.

\* \* \* \* \*